United States Patent
Stafl

(10) Patent No.: US 10,928,461 B1
(45) Date of Patent: Feb. 23, 2021

(54) LOCATION-DETERMINANT FAULT MONITORING FOR BATTERY MANAGEMENT SYSTEM

(71) Applicant: Stafl Systems, LLC, South San Francisco, CA (US)

(72) Inventor: Erik Stafl, San Francisco, CA (US)

( * ) Notice: Subject to any disclaimer, the term of this patent is extended or adjusted under 35 U.S.C. 154(b) by 0 days.

(21) Appl. No.: 16/928,191

(22) Filed: Jul. 14, 2020

Related U.S. Application Data

(60) Provisional application No. 62/891,226, filed on Aug. 23, 2019.

(51) Int. Cl.
| | |
|---|---|
| G01R 31/396 | (2019.01) |
| G01R 31/52 | (2020.01) |
| B60L 58/18 | (2019.01) |
| G01R 31/00 | (2006.01) |
| G01R 27/26 | (2006.01) |
| G01R 31/3842 | (2019.01) |
| G01R 31/371 | (2019.01) |

(52) U.S. Cl.
CPC .............. *G01R 31/52* (2020.01); *B60L 58/18* (2019.02); *G01R 27/26* (2013.01); *G01R 31/006* (2013.01); *G01R 31/371* (2019.01); *G01R 31/3842* (2019.01); *G01R 31/396* (2019.01)

(58) Field of Classification Search
None
See application file for complete search history.

(56) References Cited

U.S. PATENT DOCUMENTS

| | | | |
|---|---|---|---|
| 10,374,444 B2* | 8/2019 | Worry | H01M 10/425 |
| 2005/0270198 A1 | 12/2005 | Hehn | |
| 2007/0013382 A1 | 1/2007 | Hinz et al. | |
| 2009/0179655 A1* | 7/2009 | Trenchs Magana | H02H 5/12 324/537 |
| 2010/0289497 A1 | 11/2010 | Lum-Schue-Chan et al. | |
| 2015/0044522 A1 | 2/2015 | Camp et al. | |
| 2016/0226107 A1* | 8/2016 | Worry | H01M 10/486 |
| 2016/0313406 A1 | 10/2016 | Lin | |
| 2017/0045588 A1* | 2/2017 | Aoki | G01R 27/14 |

(Continued)

OTHER PUBLICATIONS

ISO 6469-3:2018, titled "Electrically Propelled Road Vehicles—Safety Specifications—Part 3: Electrical Safety" (Third edition Oct. 2018).

(Continued)

*Primary Examiner* — Jermele M Hollington
(74) *Attorney, Agent, or Firm* — Brad Bertoglio; Intelink Law Group, P.C.

(57) ABSTRACT

Battery management systems and methods for operation of same are provided. A first switchable resistance may be connected between a cell stack positive end and ground. A second switchable resistance may be connected between a cell stack negative end and ground. The switches for each resistance may be alternately opened and closed, with comparison of the resulting currents through each resistance being indicative of a location of isolation leakage current within a battery system cell stack, and/or the magnitude of isolation leakage current. Currents through the first and/or second switchable resistances may also be indicative of Y capacitance. The first and second switchable resistances may further be used to reduce energy stored by Y capacitance.

23 Claims, 6 Drawing Sheets

(56) References Cited

U.S. PATENT DOCUMENTS

| | | | |
|---|---|---|---|
| 2017/0120771 A1* | 5/2017 | Alser | B60L 58/21 |
| 2017/0141420 A1* | 5/2017 | Sato | H02J 1/00 |
| 2018/0229622 A1* | 8/2018 | Matsumoto | H01M 16/006 |
| 2018/0236893 A1* | 8/2018 | Matsumoto | H02M 1/38 |
| 2019/0212395 A1* | 7/2019 | Chen | H02J 7/0029 |
| 2019/0334356 A1* | 10/2019 | Hidaka | B60L 50/60 |
| 2020/0244090 A1* | 7/2020 | Irish | H02J 7/007192 |

OTHER PUBLICATIONS

International Search Report and Written Opinion of the USRO International Search Authority in PCT/US2020/042004, dated Oct. 8, 2020.

* cited by examiner

LOCATION-DETERMINANT FAULT MONITORING FOR BATTERY MANAGEMENT SYSTEM

RELATED APPLICATION AND CLAIM OF PRIORITY

This patent application claims priority to U.S. Provisional Patent Application No. 62/891,226, titled LOCATION-DETERMINANT FAULT MONITORING FOR BATTERY MANAGEMENT SYSTEM, which was filed on Aug. 23, 2019.

TECHNICAL FIELD

The present disclosure relates in general to the electronics field, and, in particular, to electronic hardware and software (i.e., computer-implemented instructions) for high voltage battery system management.

BACKGROUND

As battery cell technology and manufacturing capacity improves, electric battery cells are used in an increasingly wide variety of applications providing electrical power to powered objects. For example, high-power yet cost-effective battery packs may be critical to the commercial viability of electric cars and other motive applications that may have traditionally been powered by non-electric means. Battery systems are also increasingly used for energy storage in solar panel applications, as well as a wide variety of other industrial and consumer applications.

There are a number of design challenges in engineering systems utilizing battery packs, particularly for large format battery packs having large cell counts, with high energy density. Such battery modules may develop high voltage levels, with capacity for very high energy discharge rates, such that maintenance of electrical isolation from, e.g., surrounding systems and people, may be an important consideration for safety and reliability. For example, in a passenger vehicle, an electric motive power system is typically electrically isolated from the vehicle chassis. Vehicles must typically meet minimum isolation standards for shock hazard. Systems enabling accurate and early detection and characterization of fault conditions may be valuable contributors to overall system safety and reliability.

SUMMARY

In accordance with some embodiments, a battery management system for monitoring the operation of a battery pack is provided. The system may further include the cell stack and/or an electrically-powered object, such as an electric vehicle. The battery pack may include a cell stack comprised of a plurality of battery cells electrically connected in series. The system further contains a first electronically-controlled, switchable resistance which includes a first switch, electrically connected between a positive end of the cell stack and ground; and a second electronically-controlled, switchable resistance which includes a second switch, electrically connected between a negative end of the cell stack and ground. The switchable resistances may include a ladder of resistance with some number n bulk resistors. Each switchable resistance will preferably exceed an isolation resistance specification against which compliance is to be tested. More preferably, each ladder of resistance will have an aggregate bulk resistance greater than $n/(n-1)$ times an isolation resistance specification against which compliance is tested. The first and second resistances may each further include a measured resistance portion having a known resistance, such that current through them may be accurately determined by measuring voltage across them using an analog-to-digital converter.

In operation, a first current monitor may be configured to measure a first current I1, through the first electronically-controlled switchable resistance, when the first switch is closed and the second switch is open; and a second current monitor is configured to measure a second current I2, through the second electronically-controlled switchable resistance, when the second switch is closed and the first switch is open. The location of an isolation fault or leakage current within the cell stack is then determined based on a comparison of I1 and I2. In some embodiments, an isolation leakage current may be calculated by a microprocessor controlling the first and second switches, such as by determining a ratio of $I1/(I1+I2)$ or of $I2/(I1+I2)$. In some embodiments, the cell stack may include multiple, physically-separate, electrically-connected cell substacks, such as separate battery packs installed in varying locations within a vehicle; in such embodiments, the isolation fault location may be indicative of which substack or pack is experiencing isolation leakage current. A magnitude of isolation leakage current may also be determined, based at least in part on a comparison of a voltage V1 measured across at least a portion of the first electronically-controlled switchable resistance, and a voltage V2 measured across at least a portion of the second electronically-controlled switchable resistance.

Methods for monitoring the operation of a battery system are also provided. In some embodiments, steps include measuring a first current through the first switchable resistance when the first switch is closed and the second switch is open; measuring a second current through the second switchable resistance when the second switch is closed and the first switch is open; and determining location of an isolation leakage current within the cell stack based at least in part on the first current measurement and the second current measurement. The step of measuring a first current through the first switchable resistance may include measuring voltage across a known resistor component within the first resistance; and the step of measuring a second current through the second switchable resistance may include measuring voltage across a known resistor component within the second resistance. Embodiments may also include the step of determining a magnitude of leakage current based at least in part on the first current measurement and the second current measurement; and/or the step of initiating one of a plurality of responses to the isolation leakage current (such as transmitting a fault condition notification) based at least in part upon characterization of an isolation fault condition by mapping the isolation fault location and isolation fault magnitude.

In some embodiments, a battery system may include a Y capacitance between a chassis ground and a motive ground, e.g. in an electrically-powered vehicle. Such embodiments may include sampling the first current multiple times following closure of the first switch while the first current settles towards a steady state; and/or sampling the second current multiple times following closure of the second switch while the second current settles towards a steady state. Preferably, such sampling may be performed at least from a time of switch closure until the measured current has fallen by at least 63% from a maximum current value. A magnitude of the Y capacitance may then be evaluated based at least in part on data recorded while sampling the first and/or second current, such as by performing an exponential curve fit of sampled values against a predetermined model, such as an RC curve model. Unexpected changes in the magnitude of a measured Y capacitance may be identified, and a notification may be transmitted in response thereto.

In some embodiments, the first switch and the second switch may be closed simultaneously, such as to partially discharge a Y capacitance and reduce associated energy. The simultaneous switch closing may be controlled via hardware and/or software. In some embodiments, the first and second switches may be simultaneously closed on a period basis, such as on a duty cycle of at least 20% or a duty cycle of 25%.

In some embodiments, the battery system may further include a powered load isolation switch. A safety pre-test of the first switchable resistance and the second switchable resistance may be performed by opening the powered load isolation switch, closing the first switch and the second switch, and measuring current through the first resistance and the second resistance. If the currents through the first and second resistances differ by an amount exceeding a threshold amount, it may be determined that a failure condition is present.

BRIEF DESCRIPTION OF THE DRAWINGS

The accompanying drawings, which are incorporated into this specification, illustrate one or more exemplary embodiments of the inventions disclosed herein and, together with the detailed description, serve to explain the principles and exemplary implementations of these inventions. One of skill in the art will understand that the drawings are illustrative only, and that what is depicted therein may be adapted based on the text of the specification and the spirit and scope of the teachings herein.

In the drawings, in which non-limiting examples are illustrated, where like reference numerals refer to like reference in the specification.

DETAILED DESCRIPTION

Figure 1:
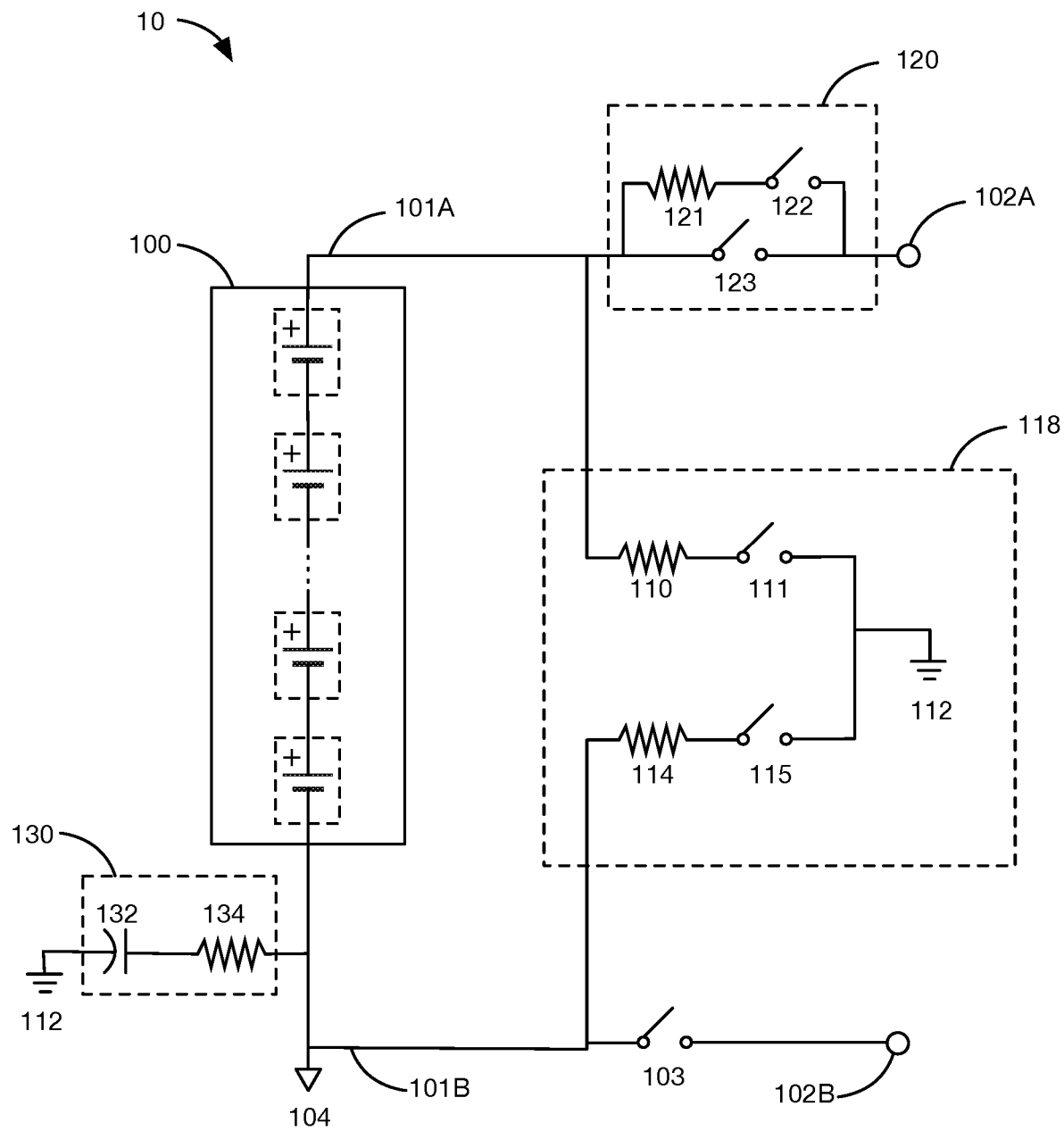
FIG. 1 illustrates a circuit schematic diagram for location-determinant fault monitoring (LDFM) by a battery management system (BMS).

In the field of battery systems, particularly for battery and energy diagnosis, management and monitoring, there were problems associated with certain conventional systems and methods for achieving shock safety, particularly with high voltage applications.

Conventional isolation specifications provide some reduction in the risk of shock but could be unreliable in certain conditions. For instance, in some areas of the United States, during cold winter months, with salt on the roads, exposure of a battery-powered vehicle to copious amounts of salt and slush or water may create additional mechanisms for electrical conduction and may serve to significantly reduce isolation resistance, e.g., to the range of 10 k$\Omega$. In such conditions, contact by a human with a portion of the vehicle battery or electromotive system under power may discharge sufficient current through the human to cause harmful electric shock, thereby increasing risk and reducing safety. Conventional solutions to this cold weather problem included isolation monitoring, which simplistically shuts down the system if isolation fails.

Related to these systems, the International Organization for Standardization (ISO) promulgated a standard, i.e., ISO 6469-3:2018, titled "ELECTRICALLY PROPELLED ROAD VEHICLES—SAFETY SPECIFICATIONS—PART 3: ELECTRICAL SAFETY", which includes two requirements, (1) a minimum isolation resistance per volt in a power system (e.g., 500 $\Omega$), and (2) a shock hazard may have a total available energy of no more than 200 mJ.

With regard to (1), in some high voltage (e.g., 400V) packs for electric vehicles, a large number of cells are provided in series to achieve high voltage levels, with substantial discharge current capabilities. To reduce the risk of shock in some vehicular applications, battery system designs typically isolate the high voltage pack from the chassis of the vehicle. Isolation resistance (i.e. the effective resistance between the high voltage battery pack and the vehicle chassis) is preferably designed to allow a human to touch the chassis and one lead on the battery system without harmful shock. In some systems, ensuring isolation resistance of 1 M$\Omega$) or more provides sufficient protection against harmful electrical shock when a human engages in a single point of electrical contact with the battery system. To maintain safe conditions, it may be valuable to actively monitor and evaluate isolation resistance so that appropriate warnings or mitigating actions may be taken in the event that conditions cause reduced isolation resistance. However, conventional systems may be less effective in monitoring isolation resistance, particularly with regard to characterizing the location of an isolation fault.

Regarding requirement (2), a battery pack or other high voltage component, such as an inverter, may include a Y-capacitor connected between the motive ground and chassis ground for purposes of high frequency EMI reduction. Especially with high frequency switching (e.g., a motor inverter, switching hundreds of volts), EMI can wreak havoc with associated systems. Some systems utilize relatively high value Y capacitors to achieve greater EMI reduction and mitigate interference with other components. However, increased Y capacitance may create a shock hazard. That is, with a high value Y capacitor, if a human makes contact across a chassis ground to a top of a cell stack (or any component electrically connected therewith), a resulting capacitor discharge (e.g., on the order of ½ EV$^2$ =½·10 $\mu$F·(400V)$^2$=800 mJ in some embodiments) to the human can be lethal or significantly harmful. Some systems were not configured to detect or reduce the risk of such harmful capacitor discharge.

It should be understood that the concepts described herein are not limited to the particular methodology, protocols, etc., listed and as such may vary. The terminology used herein is for the purpose of describing particular embodiments only and is not intended to limit the scope of the invention, which is defined solely by the claims.

As used herein and in the claims, the singular forms include the plural reference and vice versa unless the context clearly indicates otherwise. Other than in the operating examples, or where otherwise indicated, all numbers expressing quantities used herein should be understood as modified in all instances by the term "about."

All publications (including published patents) identified are expressly incorporated herein by reference for the purpose of describing and disclosing, for example, the methodologies described in such publications that might be used in connection with the invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

Unless defined otherwise, all technical and scientific terms used herein have the same meaning as those commonly understood to one of ordinary skill in the art to which this invention pertains. Although any known methods, devices, and materials may be used in the practice or testing of the invention, the methods, devices, and materials in this regard are described herein.

Some Selected Definitions

Unless stated otherwise, or implicit from context, the following terms and phrases include the meanings provided below. Unless explicitly stated otherwise, or apparent from context, the terms and phrases below do not exclude the meaning that the term or phrase has acquired in the art to which the term or phrase pertains. The definitions are provided to aid in describing particular embodiments of the aspects described herein, and are not intended to limit the claimed invention, because the scope of the invention is limited only by the claims. Further, unless otherwise required by context, singular terms shall include pluralities and plural terms shall include the singular.

As used herein the term "comprising" or "comprises" is used in reference to compositions, methods, and respective component(s) thereof, that are essential to the invention, yet open to the inclusion of unspecified elements, whether essential or not.

As used herein the term "consisting essentially of" refers to those elements required for a given embodiment. The term permits the presence of additional elements that do not materially affect the basic and novel or functional characteristic(s) of that embodiment of the invention.

The term "consisting of" refers to compositions, methods, and respective components thereof as described herein, which are exclusive of any element not recited in that description of the embodiment.

Other than in the operating examples, or where otherwise indicated, all numbers expressing quantities used herein should be understood as modified in all instances by the term "about." The term "about" when used in connection with percentages may mean ±1%.

In embodiments of the disclosure, terms such as "about," "approximately," and "substantially" may include traditional rounding according to significant figures of the numerical value.

The singular terms "a," "an," and "the" include plural referents unless context clearly indicates otherwise. Similarly, the word "or" is intended to include "and" unless the context clearly indicates otherwise. Thus, for example, references to "the method" includes one or more methods, and/or steps of the type described herein and/or which will become apparent to those persons skilled in the art upon reading this disclosure and so forth.

Although methods and materials similar or equivalent to those described herein may be used in the practice or testing of this disclosure, suitable methods and materials are described below. The term "comprises" means "includes." The abbreviation, "e.g.", is derived from the Latin exempli gratia, and is used herein to indicate a non-limiting example. Thus, the abbreviation "e.g." is synonymous with the term "for example."

To the extent not already indicated, it will be understood by those of ordinary skill in the art that any one of the various embodiments herein described and illustrated may be further modified to incorporate features shown in any of the other embodiments disclosed herein.

The following examples illustrate some embodiments and aspects of the invention. It will be apparent to those skilled in the relevant art that various modifications, additions, substitutions, and the like may be performed without altering the spirit or scope of the invention, and such modifications and variations are encompassed within the scope of the invention as defined in the claims which follow. The following examples do not in any way limit the invention.

Location-Determinant Fault Monitoring

Location-determinant fault monitoring (LDFM) for a battery management system (BMS) may overcome some or all of the aforementioned problems encountered with other BMSs for high voltage packs. The LDFM-BMS may be configured to connect with a battery pack and validate safety of a power architecture.

For instance, in some embodiments, the LDFM-BMS includes a system for determining at least one location in a cell stack (e.g., a 92 S, 160 S, 192 S, etc.) of a high voltage pack corresponding with a source of current leakage, and the extent of such leakage.

FIG. 1 illustrates a diagram of an example of a battery system 10 providing LDFM while powering a powered object, such as an electric vehicle. Cell stack 100 includes a stack of battery cells electrically connected in series. Common embodiments for electromotive applications may include, for example, series arrangements of 96, 160 or 192 cells. While the cell-stack may be referred to herein throughout as being connected in series, it is contemplated and understood that in some embodiments, such series arrangements may include series-parallel cell configurations, wherein fault locations may be determined at least relative to a particular parallel set of cells.

Cell stack 100 creates a voltage potential between top output 101A and bottom output 101B, which may be hundreds of volts in common applications. Some BMS may monitor for isolation faults by measuring current at, e.g., output 101A when the load connected to cell stack 100 is switched off. If such leakage current exceeds a threshold level, the BMS may generate a fault warning and take appropriate action. The magnitude of such leakage current may be indicative of the severity of the isolation fault.

However, such monitoring fails to provide significant information concerning the location of a fault. Without such location information, repair of a battery system showing isolation fault may be difficult and/or impracticable. Moreover, in many battery system applications, cells within cell stack 100 may be split up amongst multiple discrete, interconnected battery packs. Multiple interconnected battery packs may be utilized to, for example, provide greater flexibility in physical configuration (e.g. in an automotive application subject to weight distribution and physical volume constraints), or divide up the total battery weight into multiple units to provide easier handling of heavy battery modules. With fault location information, a faulty battery pack may be identified and swapped out, or faulty pack interconnects may be identified and repaired, potentially improving field repairability and/or reducing cost of system repair.

Figure 2A:
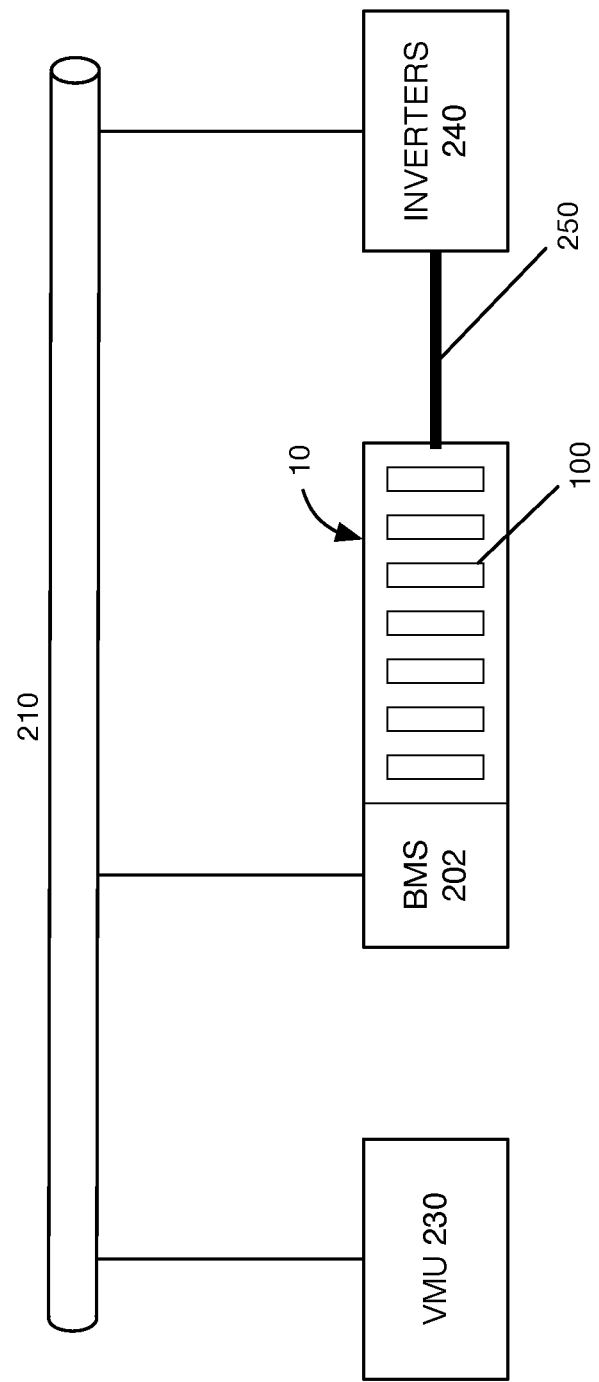
FIG. 2A is a schematic block diagram of a vehicle electromotive and control system.

Several mechanisms and techniques may be utilized to detect, locate and characterize isolation faults in the power system 10 of FIG. 1. FIG. 2A illustrates an embodiment of an overall vehicle system in which power system 10 may be implemented. Referring first to FIG. 2A for system context, power system 10 includes high density battery system 100, and integrated battery management system (BMS) 202. BMS 202 is typically powered by a vehicle 12 volt line and grounded by chassis ground, enabling communication via a common vehicle digital communications bus. BMS 202 may include a number of interconnections within power system 10, including a number of temperature sensors, voltage sensors and current sensors distributed throughout battery stack 100 and power system 10, monitoring operating conditions associated with various portions of the system. A number of sensors and analog-to-digital converters may be implemented (whether on board BMS 202 or distributed within battery pack 100 and connected digitally to BMS 202). BMS 202 then communications with vehicle management unit (VMU) 230 via a digital communications bus 210. In vehicle applications, digital communications bus 210 is commonly implemented using the CANBUS standard. VMU 230 in turn transmits control signals to vehicle drive inverters 240, which are driven by current from power system 10, and which inverters in turn supply power to electric motors or other loads within the system. While VMU 230 may be referred to as a vehicle management unit, it is contemplated and understood that in non-vehicular applications (such as stationary energy storage or other industrial applications), VMU 230 may instead be another system controller, external to power system 10, involved in control of an electrical load to be powered by power system 10.

Figure 2B:
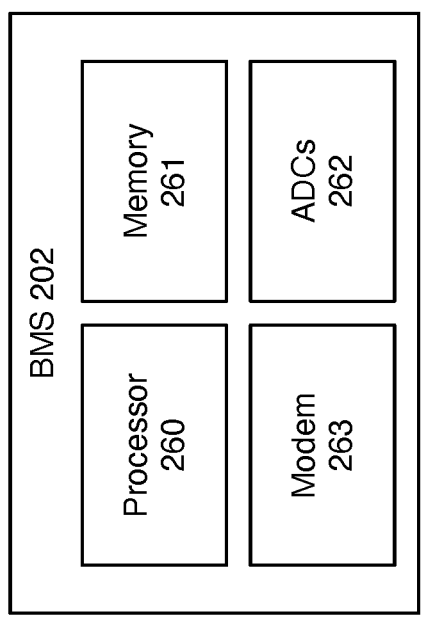
FIG. 2B is a schematic block diagram of a BMS.

FIG. 2B is a simplified block diagram of portions of BMS 202. BMS 202 includes a microprocessor 260, digital memory 261 (storing, amongst other things, software instructions utilized to cause microprocessor 260 to perform various calculations, operations and other functions described elsewhere herein) and multiple analog-to-digital converters (ADCs) 262. Optionally, a communications interface such as modem 263 may be provided in order to enable digital communications with remotely located systems; in some embodiments, modem 263 will include, for example, an ethernet interface, wireless ethernet interface and/or cellular data modem to enable communications between BMS 202 and cloud-based or network-connected systems, such as for automatic updates, remote or centralized battery system performance monitoring, and/or fault alerting. In other embodiments, a network communications interface may be provided externally to BMS 202 (such as via another system connected to communications bus 210).

Figure 2C:
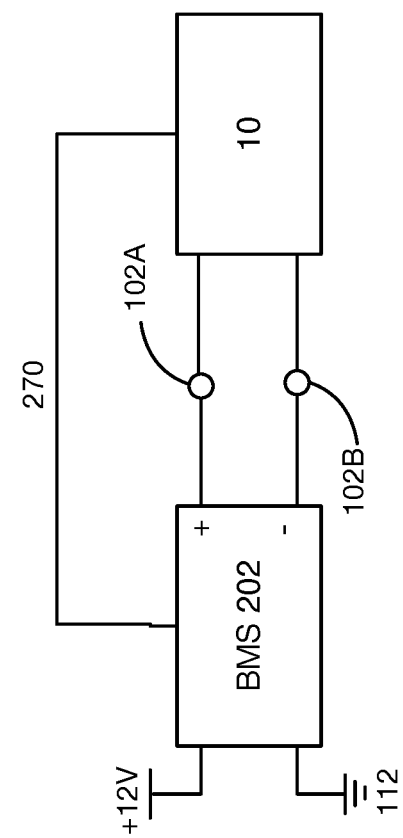
FIG. 2C is a schematic block diagram of a high voltage power system.

Various levels of integration may be provided between BMS 202 and a battery pack. In some embodiments, one or more components of BMS 202 may be implemented within the battery pack itself. In other embodiments, BMS 202 may be completely physically separate from, but electrically connected with, the battery pack. In some embodiments, LDFM assembly 118 may be physically housed within a separate BMS 202, while in other embodiments, LDFM assembly 118 may be physically housed within a battery pack (e.g. battery system 10 of FIG. 1) and electrically interconnected with a separately-housed BMS. In yet other embodiments, some or all components of BMS 202 may be physically integrated with a battery pack. FIG. 2C illustrates one exemplary relationship between BMS 202 and a battery system 10, in which BMS 202 monitors output terminals 102A and 102B of battery system 10, while providing control lines 270 (e.g. to operate switches and measure voltages within battery system 10). Embodiments illustrated herein are intended to be illustrative, with the understanding that other variations and permutations may be readily implemented.

Unlike conventional BMS's, which monitor overall battery pack voltage and output current, in some embodiments, the LDFM-enabled BMS 202 may be configured to connect/disconnect a high side and/or a low side of cell stack 100 to a chassis ground through a switchable ladder of resistance, as shown in FIG. 1. In particular, battery system 10 may include a LDFM assembly 118. LDFM assembly 118 includes a resistor 110 and electronically-controlled switch 111 connected in series between positive terminal 101A of cell stack 100, and chassis ground 112. LDFM assembly 118 further includes resistor 114 and electronically-controlled switch 115 connected in series between negative terminal 101B of cell stack 100 and chassis ground 112.

In some embodiments (which may be appropriate for many electric vehicle applications), switches 111 and 115 may be 1000V-rated switches. Resistors 110 and 114 are preferably resistor packs formed from multiple resistors, such that failure of any one resistor will not create an undesirably high discharge rate when its associated switch is closed. The resistance of resistors 110 and 114 should be greater than the isolation resistance specification for which compliance is to be tested, but low enough that current flows through them can be accurately measured by a cost-effective ADC implemented within BMS 202 or elsewhere. Thus, for a resistor pack comprised of n bulk resistors seeking to test against a X MΩ minimum isolation resistance, the aggregate bulk resistance of the resistor pack will preferably exceed $n/(n-1)$ times X, such that any one resistor within the resistor pack may fail while still ensuring that the resistor pack resistance exceeds the desired isolation resistance specification.

As a practical example, in an electric vehicle with a 400V battery system and a 1 MΩ minimum isolation resistance specification, resistors 110 and 114 may each comprise a 5.1 MΩ resistor pack formed from bulk resistance (e.g. five resistor bodies having 1 MΩ resistance each) and a 100 kΩ measured resistance. In such an embodiment, if one of the bulk resistors fails, the resulting interconnection between cell stack 100 and chassis ground 112 will still have a resistance of at least 4 MΩ, which may remain well above the minimum isolation resistance specified by applicable standards (e.g. 1 MΩ for ISO 6469-3:2018).

An analog-to-digital converter (e.g. ADCs 262 integrated within BMS 202, or ADCs otherwise connected to BMS 202) may be applied across the 100 kΩ measured resistor portion of resistors 110 and 114, to enable BMS 202 to determine current flow through resistors 110 and 114, upon closure of switches 111 and 115, respectively. A position of an isolation fault may be determined by measuring current flow through resistor 110 when switch 111 is closed and switch 115 is open, and by measuring the current flow through resistor 114 when switch 111 is open and switch 115 is closed.

Figure 3:
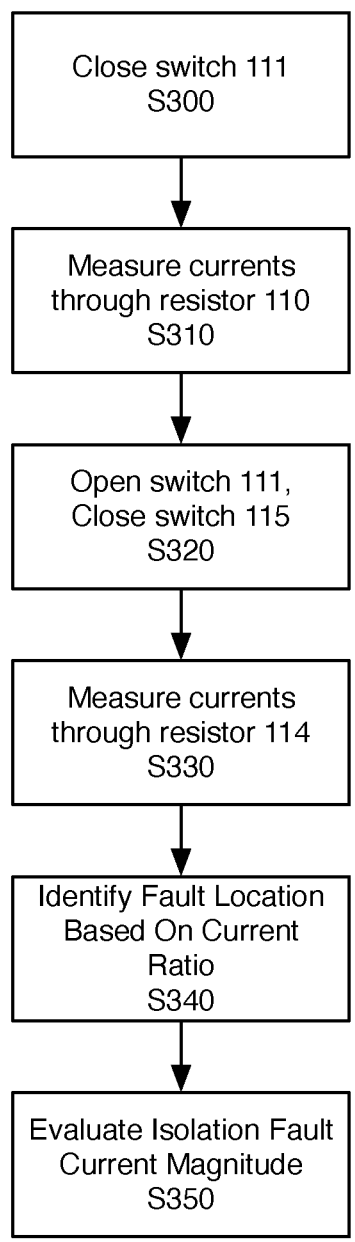
FIG. 3 is a process for location-determinant fault monitoring (LDFM).

In particular, FIG. 3 illustrates a process for operating LDFM assembly 118 (e.g. by a microcontroller within BMS 202) to evaluate the location and magnitude of an isolation fault. In step S300, microprocessor 260 operates to temporarily close switch 111. In step S310, microprocessor 260 measures current through resistor 110, e.g. by measuring voltage across a calibrated or measured resistance portion of resistor 110 using an ADC 262 within BMS 202. In step S320, switch 111 is opened and switch 115 is closed. In step S330, current through resistor 114 is measured similarly (e.g. by measuring voltage across a calibrated or measured resistance portion of resistor 114 using an ADC 262 within BMS 202).

In step S340, BMS 202 identifies location of an isolation fault based on a comparison of currents measured in steps S310 and S330. For example, upon closing bottom (negative) switch 115 in step S330: if natural leakage is on the negative side 101B of battery pack 100, no change is observed (i.e. no current flows through resistor 114); on the other hand, if leakage is present on the positive side 101A, then a current can be measured through resistor 114. Upon closing of top (positive) switch 111 in step S310: if natural leakage is on the negative side 101B, a current can be measured through resistor 110; and, if leakage is on the positive side 101A, then no change is observed (i.e. no current flows through resistor 110). If the isolation fault is in the exact middle of cell stack 100 (for instance, between a pair of different battery sub-packs, or if there is a bad cell in the middle of cell stack 100 (e.g., a tin whisker creating a path to ground)), then equal current can be measured through resistor 110 in step S310 (when switch 111 is closed) and through resistor 114 in step S330 (when switch 115 is closed). As such, by operating BMS 202 to alternatively close switches 111 and 115, the ratio of measured currents can be used to identify the relative location within cell stack 100 at which an unintended leakage current (i.e. isolation fault) is located.

Figure 4:
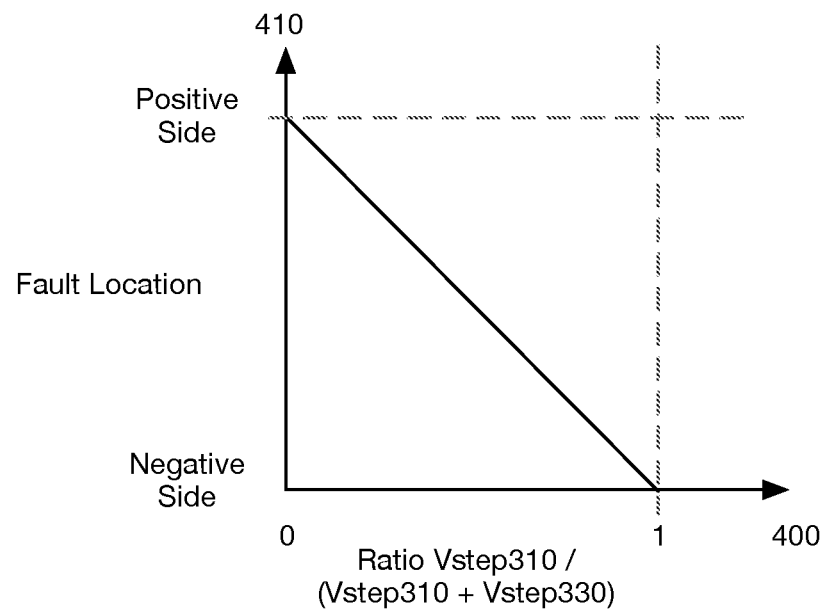
FIG. 4 is a plot of isolation fault location relative to measured parameters.

FIG. 4 illustrates one exemplary mapping of measured voltages to fault location. Horizontal axis 400 comprises the ratio of current measured in step S310 ($I_1$), to the sum of currents measured in step S310 and S330 ($I_1+I_2$) (both normalized based on the magnitude of current measured in step S310). (Provided that the measured resistances in resistor packs 110 and 114 are the same, the voltages measured across those resistors may be used directly in calculating the ratio.) Vertical axis 410 is the position (electrically) of the isolation fault as between cell stack top 101A (positive side) and cell stack bottom 101B (negative side). If the ratio is zero (i.e. no current/voltage is measured in step S310), then the isolation leakage current is determined to be located at cell stack positive side 101A. If the ratio is 1 (i.e. no current/voltage is measured in step S330), then the isolation leakage current is determined to be located at cell stack negative side 101B. Ratios between 0 and 1 indicate the relative position of isolation leakage current as between the positive and negative sides of the cell stack. For example, if the ratio is 0.5 (i.e. currents measured in steps S310 and S330 are exactly equal) then the isolation leakage current is determined to be located half way between positive side 101A and negative side 101B. While the formula $I_1/(I_1+I_2)$ may be used in some embodiments, it is contemplated and understood that other formulas may be likewise used, based on the above-described principals. For example, another embodiment may use the formula $I_2/(I_2=I_1)$, with a zero result indicative of fault location at the negative terminal 101B, a one result indicative of fault location at the positive terminal 101A, and results in between being proportional to the distance of the leakage current location between negative terminal 101B and positive terminal 101A.

Additionally, the absolute magnitudes of currents through resistors 110 and 114 measured in steps S310 and S330 may be used by BMS 202 to evaluate the magnitude of the isolation fault (step S350). In particular, in some embodiments, the LDFM-enabled BMS 202 may be configured to control switches 111 and 115. When the switches 111 and 115 are open, zero voltage is measured across measurement resistors 110 and 114, respectively as it is an open circuit. Upon closing top switch 111, an electrical path with a resistance of 5.1 MΩ is inserted between battery positive 101A and chassis ground 112. The 5.1 MΩ is a fixed resistance defined by resistor 110. If no leakage or parasitic resistance is present, no current will flow and zero voltage is measured across resistor 110. However, if a leakage (or parasitic) resistance X is present between any point besides node 101A and chassis ground, a small current will flow, resulting in a measurable, non-zero voltage across resistor 110. The magnitude of this current is equal to I=(Vbattery−Vposition_of_leakage)/(5.1 MOhm+X). In a similar fashion, control switch 115 can be closed to measure the current flow through resistor 114. If a leakage (or parasitic) resistance X is present between any point besides node 101B and chassis ground, a small current will flow. The magnitude of this current is equal to I=(Vposition_of_leakage)/(5.1 MOhm+X). By solving for X and Vposition_of_leakage with these two equations, both a magnitude and electrical position of the new leakage resistance can be determined.

Figure 5:
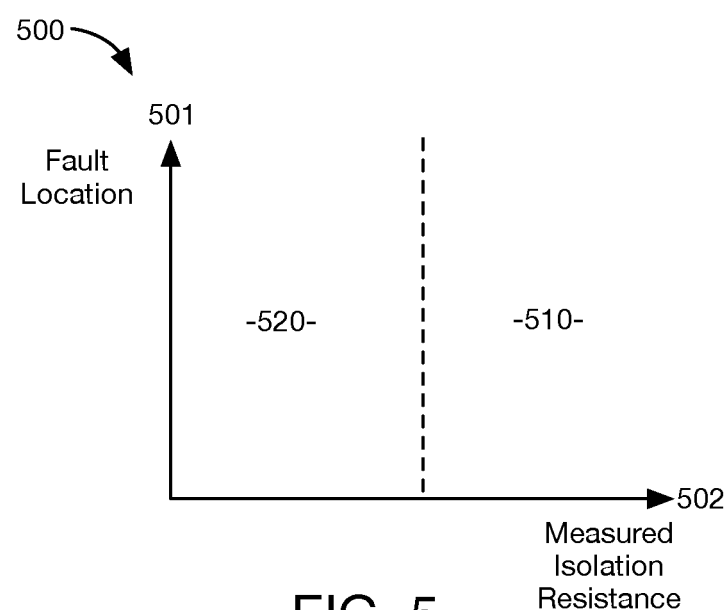
FIG. 5 is a plot of isolation fault location versus measured isolation resistance, for fault characterization.

In this way, LDFM assembly 118 may be utilized by BMS 202, or an accessory system to which BMS reports, to characterize an isolation fault, such as a characterization of whether remedial action is appropriate (such as communication a fault alert and/or automatically depowering a system). In some embodiments, BMS 202 may determine both the magnitude and location of an isolation fault, and portray the two measurements as X and Y locations on a fault characterization graph. Isolation faults may be plotted accordingly, with plot regions utilized to classify types of faults. FIG. 5 illustrates an exemplary plot 500 of fault location within cell stack 100 on the Y axis 501, and isolation resistance magnitude on the X axis 502. Faults within region 510 correspond to acceptable modes of operation and faults within region 520 correspond to unsafe operating conditions. In other embodiments, additional or alternative types of fault characterizations may be applied as fault characterizations, for example: acceptable isolation resistance, acceptable but concerning isolation resistance (potentially triggering a warning or notification for further monitoring or investigation), and/or one or more categories of unacceptable isolation resistance associated with different responsive functions (e.g. notifications, and/or alteration of system operation potentially including electromotive system shutdown). In some embodiments, additional or alternative fault measurements may be utilized to characterize a fault; in some such circumstances, fault characterizations may effectively be mapped in a 3D or hyperdimensional space.

In practice, in some embodiments, it has been found that the LDFM-enabled BMS configuration shown in FIGS. 1 and 2 may be used to measure parasitic resistance up to 50 MΩs with reasonable accuracy and using standard commercial components. In some embodiments, locations of a parasitic resistance up to 50 MΩs could be determined within a cell or two within a stack of over one hundred cells. As parasitic resistance and capacitance varies, the precision with which the LDFM-BMS may locate an isolation fault may vary as well. For example, for a relatively small, i.e., 1-2 mJ, shock hazard system, accuracy may be relatively poor, i.e., on the order of +/−1 to 5 cells in a 192 S cell stack.

Whereas, with a relatively large shock hazard (i.e. increased Y capacitance), precision is relatively accurate, potentially enabling reliable identification of a specific cell at which an isolation fault occurs.

In some embodiments, as mentioned above, for some applications such as certain vehicular applications, cell stack 100 may be comprised of multiple separate battery modules (i.e. cell substacks), potentially located in distinct physical locations within a vehicle. For example, a vehicular battery pack may be comprised of multiple interconnected 24 S packs, potentially provided improved part modularity and/or improved flexibility for physical positioning within a vehicle. Use of LDFM embodiments described herein may be particularly helpful in embodiments with multiple separate battery packs, as an engineer can more readily ascertain which of a plurality of packs is leaking.

The battery pack formed from cell stack 100 may be connected to external systems at output terminals 102A and 102B, via a switching network 120, to avoid unintended discharge and improve safety. Switching network 120 may include a first branch comprising a series combination of resistor 121 and switch 122, and a second branch comprising switch 123, the second branch being in parallel with the first branch. During application of power from cell stack 100 to a load connected at terminal 102A, switch 122 may be closed first, with resistor 121 providing a current-limiting function in the event that an improper load is connected. Upon determining that the load is appropriate (e.g. by measuring current through resistor 121), switch 123 may be closed to provide the full output capacity of cell stack 100.

A LDFM-BMS may also be utilized to improve upon problems associated with maximum shock hazard energy (such as the second portion of the aforementioned ISO shock standard, imposing a 200 mJ maximum shock hazard). In some embodiments, the LDFM-BMS may be configured to detect and characterize a Y capacitance, by monitoring current flow through a resistor over time.

As described above, battery pack embodiments often include a Y capacitor, placed between chassis ground and motive ground (such as EMI Filter 130 in the embodiment of FIG. 1). Such a capacitor may be beneficial in reducing EMI interference. EMI interference can be particularly problematic in electromotive vehicle applications, e.g. with motor inductors performing high-frequency switching of hundreds of volts. In particular, electric racing vehicles are often equipped with particularly high-value Y capacitors.

While Y capacitors may be useful in reducing EMI interference, such implementations also may create an additional shock hazard. For example, when the Y capacitor is energized, if a human touches across chassis ground and the top of a cell stack, the energy of the Y capacitor may be fully discharged into the human's body despite high levels of isolation resistance. Depending on the capacitance, the amount of energy discharged could be harmful or even fatal. Thus, detecting and characterizing Y capacitance may be highly beneficial for safety and/or other purposes.

Thus, in some embodiments, LDFM assembly 118 is utilized to detect and characterize Y capacitance in a power system. In particular, when switch 111 is closed (such as in step S300), rather than simply measuring steady-state current through (or voltage across) resistor 110 (e.g. in step S310) (or through resistor 114 in step S330 after switch 115 is closed in step S320), the current through (i.e. voltage across) resistors 110 and 114 is sampled over time (e.g. in steps S310 and S330). The system's Y-capacitance (such as caused at least in part by EMI filter 130 comprising Y capacitor 132 and resistance 134) provides a capacitance in parallel with resistor 110 (when switch 111 is closed) or resistor 114 (when switch 115 is closed). Characterization of the current flow through a resistor in a parallel RC circuit is well-known. Thus, the current/voltage curve for resistors 110 and 114 can be sampled over time by BMS 202, with the resulting sampled data then characterized according to known RC circuit behavior to solve for the value of Y capacitance.

Figure 6:
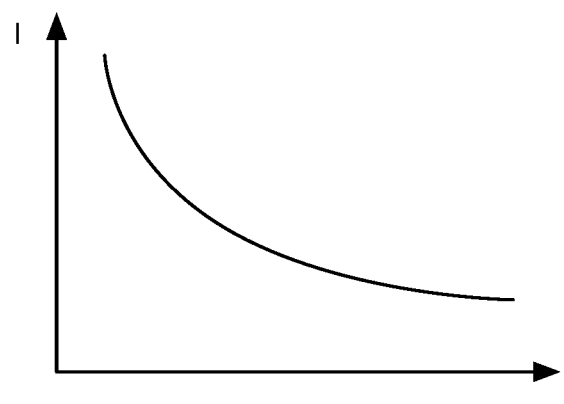
FIG. 6 is a plot of LDFM monitor current settlement over time in the presence of Y capacitance.

Thus, some embodiments are configured to: plot magnitude of current through (or voltage across) resistor 110 or 114 over time, which tends to start relatively high and decrease over time to generate a settling curve (i.e. an RC curve) (as illustrated in FIG. 6), which is a two-parameter model; and from that, calculate leakage resistance and Y capacitance. In accordance with an illustrative embodiment, exemplary parameters may be as follows: if resistors 110 and 114 are 5 MΩ each and Y capacitance is 10 µF (a high value, but potentially valuable for certain applications), then the RC curve has a time constant of about 50 seconds. Approximately one time constant is a good measurement period to be able to extrapolate the leakage resistance and Y capacitance, with a least squares exponential curve fit. Since the Y capacitance is unknown when initially sampling, waiting for the measurement current to fall by 63% from its initial value can be used as the determining factor as to when to stop sampling.

While Y-capacitance is typically caused by an inverter EMI filter, in some circumstances, other system effects may cause or contribute to Y capacitance. Thus, embodiments described herein may further be utilized to monitor (potentially over time) for changes in, or unexpected, Y capacitance. Warnings or other notifications may then be transmitted (e.g. by BMS 202) upon identification of a change over time in Y capacitance, exceeding a threshold level of change. For instance, some battery packs may be configured with numerous parallel plates, which are stacked relatively close to one another for thermal performance. With such configurations, a relatively high dielectric is provided for isolation, which effectively forms a capacitor. In such cases, parasitic Y capacitance, e.g., up to 10 nF in some circumstances, may be observed. Such levels of parasitic Y capacitance may be considered in the overall system design.

Furthermore, in some embodiments, components described herein may be operated to not only measure, but also mitigate overall shock potential. Specifically, when both switches 111 and 115 are closed, the Y capacitance charges up to a maximum of ½ the pack voltage rather than 1 times the pack voltage. By periodically closing both switches, energy may be bled from the Y-capacitance and potential discharge current from parasitic capacitance may be reduced. In many embodiments, closing both switches 110 and 114 with a 25% duty cycle will be sufficient to provide mitigation of discharge current from parasitic capacitance. If the Y capacitance is sustained at an average charge of 200V instead of 400V, this effectively moves the Y capacitance to the middle of the stack. Because energy stored in a capacitor is proportional to the square of the capacitance charge voltage (i.e. ½ $CV^2$), reducing the capacitance voltage level in half will reduce the discharge energy by 75%. Considering the above-described embodiment with a 10 µF Y capacitor installed in a 400V battery system potentially yielding an 800 mJ shock hazard, operating switches 110 and 114 to maintain average capacitor charge of 200V reduces the maximum shock hazard to ½·10 µF·$(200V)^2$ =200 mJ instead of 800 mJ. As such, even with a relatively high capacitance for EMI reduction purposes, unlike typical conventional systems, the shock hazard may still be maintained at or near the ISO standard limit.

Switches may be controlled with software and/or hardware. In the context of using switches to achieve shock safety, hardware control is preferred to reduce likelihood of failure. For example, in some embodiments, switches 111 and 115 are hardware controlled with a fixed 20% duty cycle.

Still further, analogously to the detection of parasitic capacitance, BMS 202 may be configured to detect inductance in the system by monitoring current through resistors 110 and 114 over time, using well-known inductance curves.

Many systems, such as electric vehicle systems, that involve high voltage (sometimes on the order of 1000V), are equipped with switches and pre-charge systems that control the connection of the battery pack to the rest of the high voltage system. In such embodiments, the LDFM-BMS may be configured into the battery pack to permit testing of the system with open pre-charge switches so as to measure the parasitic resistance and capacitance of the battery pack as an isolated subunit within the high voltage system; and subsequent closing of the pre-charge switches so as to connect to the rest of the high voltage system and test the parasitic resistance and capacitance of the high voltage system as a whole.

The LDFM-BMS may be configured to conduct a safety pre-test for failure of 5 MΩ test branches within LDFM assembly 118 as a self-test, by closing both switches 111 and 115, and determining whether the pack is isolated based on a comparison of a current through both 5 MΩ resistors 111 and 115. That is, the system signals proper functioning and isolation when the same current is flowing through both 5 MΩ resistors (i.e., the difference between currents measured through resistor 111 and resistor 115 is below a predetermined threshold), and improper functioning or failure when a different current is flowing through both 5 MΩ resistors (i.e., the difference between currents is above the predetermined threshold). Also, the system may be configured so that a calculated isolation resistance below a predetermined threshold stops use of the test circuit.

Figure 7:
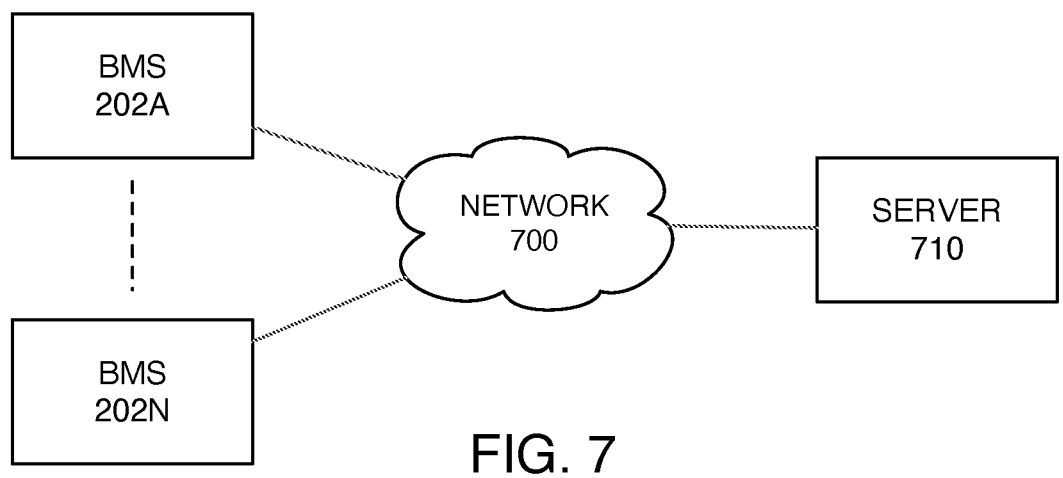
FIG. 7 is a block diagram of a network-connected BMS monitoring system.

In some embodiments, the LDFM-BMS 202 may be configured for connection to the internet, such as via modem 263 or via another network communications interface provided by an external system (e.g. another system connected with communications bus 210) for communication of information from BMS 202. In such circumstances, the LDFM-BMS may be configured to allow central monitoring for one or more vehicles. FIG. 7 illustrates such an embodiment. A plurality of BMS 202A to 202n, may communicate via data network 700 (preferably including the Internet) with a remote server 710. Server 710 may aggregate fault information from BMS 202A-n. Server 710 may be configured to aggregate generate indicia of fault reported from BMS 202A-n, e.g., by generating a report linking a vehicle identification to an isolation fault, i.e., "Vehicle VIN <17 alphanumeric values> has an isolation fault". As such, the server 710 may be configured to determine, for example, if a vehicle returning a fault is in a location subject to extreme environmental conditions that might affect system performance (such as cold weather and salt-covered roads), potentially observed to be impacting multiple vehicles in the region, or if the vehicle is reporting an anomalous fault that appears to be linked to system malfunction.

The above disclosures and descriptions are exemplary in nature, and not intended to limit the scope of the invention. Any person skilled in the art given the present disclosures could design variations and additional embodiments of the same invention based on these disclosures, which are all covered by this application for letters patent.

Although some of various drawings illustrate a number of logical stages in a particular order, stages which are not order dependent may be reordered and other stages may be combined or broken out. Alternative orderings and groupings, whether described above or not, may be appropriate or obvious to those of ordinary skill in the art of computer science. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to be limiting to the precise forms disclosed. Many modifications and variations are possible in view of the above teachings. The embodiments were chosen and described in order to best explain the principles of the aspects and its practical applications, to thereby enable others skilled in the art to best utilize the aspects and various embodiments with various modifications as are suited to the particular use contemplated.

I claim:

1. A battery management system for monitoring the operation of a battery pack containing a cell stack comprised of a plurality of battery cells electrically connected in series, the battery management system comprising:
    a first electronically-controlled, switchable resistance comprising a first switch, electrically connected between a positive end of the cell stack and ground;
    a second electronically-controlled, switchable resistance comprising a second switch, electrically connected between a negative end of the cell stack and ground;
    a first current monitor configured to measure a first current $I_1$, through the first electronically-controlled switchable resistance, when the first switch is closed and the second switch is open; and
    a second current monitor configured to measure a second current $I_2$, through the second electronically-controlled switchable resistance, when the second switch is closed and the first switch is open;
    wherein an isolation fault location within the cell stack is determined based on a comparison of $I_1$ and $I_2$.

2. The battery management system of claim 1, in which: The first and second electronically-controlled switchable resistances each comprise a ladder of resistance comprising a number n bulk resistors, where n is greater than one.

3. The battery management system of claim 2, which said ladders of resistance each have an aggregate bulk resistance greater than n/(n−1) times an isolation resistance specification against which compliance is tested.

4. The battery management system of claim 2, in which:
    the first electronically-controlled switchable resistance further comprises a first measured resistance;
    the first current monitor comprises an analog-to-digital converter measuring voltage across the first measured resistance;
    the second electronically-controlled switchable resistance further comprises a second measured resistance; and
    the second current monitor comprises an analog-to-digital converter measuring voltage across the second measured resistance.

5. The battery management system of claim 1, further comprising:
    a microprocessor configured to control operation of the first and second switches, and to further calculate a ratio of $I_1/(I_1+I_2)$ as an indication of the location of isolation leakage current between the positive terminal and the negative terminal.

6. The battery management system of claim 1, further comprising said cell stack.

7. The battery management system of claim 6, further comprising an electrically-powered object connected with said cell stack to enable powering of said object by said cell stack.

8. The battery management system of claim 7, in which said electrically-powered object comprises an electric vehicle.

9. The battery management system of claim 1, further comprising a microprocessor, the microprocessor configured to:
control operation of the first and second switches;
determine an indication of the location of isolation leakage current between the positive terminal and the negative terminal based on a comparison of a voltage V1 measured across at least a portion of the first electronically-controlled switchable resistance, and a voltage V2 measured across at least a portion of the second electronically-controlled switchable resistance; and
determine a magnitude of isolation leakage current based at least in part on V1 and V2.

10. The battery management system of claim 6, wherein:
said cell stack comprising a plurality of physically-separate, electrically-connected cell substacks; and
the isolation fault location is indicative of one of said cell substacks being associated with an isolation leakage current.

11. A method for monitoring the operation of a battery system comprised of a cell stack having a plurality of battery cells connected in series; a first switchable resistance comprising a first electronically controlled switch in series with a first resistance, connected between the cell stack positive and ground; a second switchable resistance comprising a second electronically controlled switch in series with a second resistance, connected between the cell stack negative and ground; the method comprising the steps of:
measuring a first current through the first switchable resistance when the first switch is closed and the second switch is open;
measuring a second current through the second switchable resistance when the second switch is closed and the first switch is open;
determining location of an isolation leakage current within the cell stack based at least in part on the first current measurement and the second current measurement.

12. The method of claim 11, in which:
the step of measuring a first current through the first switchable resistance comprises measuring voltage across a known resistor component within the first resistance; and
the step of measuring a second current through the second switchable resistance comprises measuring voltage across a known resistor component within the second resistance.

13. The method of claim 11, further comprising:
determining a magnitude of leakage current based at least in part on the first current measurement and the second current measurement.

14. The method of claim 13, further comprising:
initiating one of a plurality of responses to the isolation leakage current based at least in part upon characterization of an isolation fault condition by mapping the isolation fault location and isolation fault magnitude.

15. The method of claim 14, in which the step of initiating one of a plurality of responses comprises: transmitting a fault condition notification.

16. The method of claim 11, wherein:
the battery system further comprises a Y capacitance between a chassis ground and a motive ground in an electrically-powered vehicle;
with regard to the method:
the step of measuring a first current through the first switchable resistance when the first switch is closed and the second switch is open, further comprises sampling the first current multiple times following closure of the first switch while the first current settles towards a steady state; and/or
the step of measuring a second current through the second switchable resistance when the second switch is closed and the first switch is open, further comprises sampling the second current multiple times following closure of the second switch while the second current settles towards a steady state
and the method further comprises determining a magnitude of the Y capacitance based at least in part on data recorded while sampling the first and/or second current.

17. The method of claim 16, wherein:
the step of sampling the first current comprises sampling the first current at least from closure of the first switch until the measured current has fallen by at least 63% from a maximum value; and
the step of determining a magnitude of the Y capacitance comprises performing an exponential curve fit of sampled values against a predetermined model.

18. The method of claim 17, wherein the predetermined model is an RC curve.

19. The method of claim 16, further comprising: identifying a change in magnitude of the Y capacitance; and transmitting a notification in response thereto.

20. The method of claim 11, further comprising: periodically closing the first switch and the second switch simultaneously.

21. The method of claim 20, wherein the step of periodically closing the first switch and the second switch simultaneously comprises closing the first switch and the second switch simultaneously with a duty cycle of at least 20%.

22. The method of claim 11, in which the battery system further comprises a powered load isolation switch, and the method further comprises:
conducting a safety pre-test of the first switchable resistance and the second switchable resistance by opening the powered load isolation switch, closing the first switch and the second switch, and measuring current through the first resistance and the second resistance; and
determining that a failure condition is present if a difference between the current through the first resistance and the current through the second resistance exceeds a threshold amount.

23. The method of claim 11, further comprising transmitting information characterizing the isolation leakage current to a network-connected server for centralized monitoring of a plurality of deployed battery systems.

* * * * *